United States Patent
Mickan et al.

(10) Patent No.: US 7,960,074 B2
(45) Date of Patent: Jun. 14, 2011

(54) METHOD OF GENERATING A PHOTOLITHOGRAPHY PATTERNING DEVICE, COMPUTER PROGRAM, PATTERNING DEVICE, METHOD OF DETERMINING THE POSITION OF A TARGET IMAGE ON OR PROXIMATE A SUBSTRATE, MEASUREMENT DEVICE, AND LITHOGRAPHIC APPARATUS

(75) Inventors: Uwe Mickan, Veldhoven (NL); Hendricus Johannes Maria Meijer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1141 days.

(21) Appl. No.: 11/345,629

(22) Filed: Feb. 2, 2006

(65) Prior Publication Data

US 2006/0194123 A1 Aug. 31, 2006

Related U.S. Application Data

(60) Provisional application No. 60/649,079, filed on Feb. 3, 2005.

(51) Int. Cl.
*G03F 1/00* (2006.01)
*G06F 17/50* (2006.01)

(52) U.S. Cl. .............................. 430/5; 716/55
(58) Field of Classification Search ................ 430/5, 30; 716/19, 21; 355/69; 382/144
See application file for complete search history.

(56) References Cited

U.S. PATENT DOCUMENTS 4,329,410 A 5/1982 Buckley
6,297,876 B1 10/2001 Bornebroek
(Continued)

FOREIGN PATENT DOCUMENTS

EP 1 061 561 A1 12/2000
EP 1 434 099 A1 6/2004

OTHER PUBLICATIONS

European Search report issued in EP Application No. 06 10 1178 dated Dec. 7, 2006.
(Continued)

*Primary Examiner* — Stephen Rosasco
*Assistant Examiner* — Stewart A Fraser
(74) *Attorney, Agent, or Firm* — Pillsbury Winthrop Shaw Pittman LLP

(57) ABSTRACT

A method of generating a photolithography patterning device for transferring a pattern formed in the patterning device onto a substrate utilizing a lithographic projection apparatus includes defining features within the pattern formed in the device, wherein the features have dimensions and orientations chosen to create a desired image on the substrate during pattern transfer; and adjusting the dimensions of the features to compensate the desired image for displacement and dimension errors introduced by the effective shadow angle of the radiation on the features during pattern transfer or correlated to the position of the features within the exposure slit during pattern transfer. A measurement device for determining the position of a target image on or proximate a substrate in a lithographic projection apparatus, wherein the target image is formed by features on a patterning device, includes a detector configured to measure the position of the target image on or proximate the substrate, wherein the detector compensates the measured position of the target image for displacement and dimension errors introduced by the effective shadow angle of the radiation on the features of the patterning device during pattern transfer or correlated to the position of the features within the exposure slit during pattern transfer. A lithographic apparatus includes a measurement device.

8 Claims, 11 Drawing Sheets

U.S. PATENT DOCUMENTS

| | | | |
|---|---|---|---|
| 6,387,572 B1 * | 5/2002 | Tong et al. | 430/5 |
| 6,806,007 B1 | 10/2004 | Abdo et al. | |
| 7,094,507 B2 * | 8/2006 | Hirscher et al. | 430/5 |
| 7,129,010 B2 * | 10/2006 | Alkemper et al. | 430/5 |
| 2003/0003383 A1 | 1/2003 | Van Der Werf et al. | |
| 2003/0013216 A1 | 1/2003 | Rau | |
| 2003/0017402 A1 * | 1/2003 | Davis et al. | 430/5 |
| 2003/0039894 A1 * | 2/2003 | Yan et al. | 430/5 |
| 2003/0162104 A1 | 8/2003 | Shoki | |
| 2004/0137677 A1 * | 7/2004 | Lowisch et al. | 438/232 |
| 2004/0166420 A1 * | 8/2004 | Aschke et al. | 430/5 |
| 2004/0227921 A1 * | 11/2004 | Sato et al. | 355/69 |

OTHER PUBLICATIONS

Pei-yang Yan, "The Impact of EUVL Mask Buffer and Absorber Material Properties on Mask Quality and Performance", Proceedings of the SPIE, vol. 4688, pp. 150-160 (Mar. 2002), XP009019090.

Minoru Sugawara et al., "Effect of incident angle of off-axis illumination on pattern printability in extreme ultraviolet lithography", J. Vac. Sci. Technol. B, vol. 21, No. 6, pp. 2701-2705 (2003), XP002380804.

Partial European Search Report issued in EP 06 10 1178 dated May 16, 2006.

* cited by examiner illuminated slit
3D structure
light path
optic pupil
OA
Y
X
mask coordinate system Y(scan direction)
1/2 slit
Slit height
azimuth
radius
OA
X

METHOD OF GENERATING A PHOTOLITHOGRAPHY PATTERNING DEVICE, COMPUTER PROGRAM, PATTERNING DEVICE, METHOD OF DETERMINING THE POSITION OF A TARGET IMAGE ON OR PROXIMATE A SUBSTRATE, MEASUREMENT DEVICE, AND LITHOGRAPHIC APPARATUS

CROSS REFERENCE TO RELATED APPLICATION

This application claims priority to U.S. Application 60/649,079, filed Feb. 3, 2005, the entire contents of which are incorporated herein by reference.

BACKGROUND OF THE INVENTION

1. Field of the Invention

The present invention relates to a method of generating a photolithography patterning device, a computer program, a patterning device, a method of determining the position of a target image on or proximate a substrate, a measurement device, and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to accurately apply a desired pattern onto a target portion of a substrate, the reticle should be aligned with respect to the substrate. Therefore, according to the prior art, the relative position of the reticle with respect to the substrate is set accurately, by measuring and adjusting the relative position. Alignment of the patterning device with respect to the substrate is, according to the state of the art, done using two alignment actions.

In the first action the substrate is aligned with respect to the substrate stage carrying the substrate, while in the second action the reticle is aligned with respect to the substrate stage. As a result of these two actions, the reticle is aligned with respect to the substrate, as desired.

In case a single stage machine is used, the first and second action are carried out at the exposure position. In case a dual stage machine is used, the first action may be carried out at a first position, remote from the exposure position. Then, the substrate stage with the substrate positioned on it is transported to the exposure position, where the second action is performed.

The first action may be carried out with two sensors. A first sensor measures the relative position of the substrate with respect to the substrate stage in X, Y and Rz directions, where the XY plane is defined as the plane that is substantially parallel with the surface of the substrate, the X- and Y-directions being substantially perpendicular with respect to each other. The Z-direction is substantially perpendicular with respect to the X- and Y-directions, so Rz represents a rotation in the XY plane, about the Z-direction. A more detailed description about this sensor is for instance provided in U.S. Pat. No. 6,297,876. A second sensor, usually referred to as the level sensor, measures the height of the substrate surface in dependence on locations on the substrate to be exposed, creating a height map based on the determined heights, and also determines the rotations about the X and Y axes: Rx, Ry.

Next, in the second action, the reticle is aligned with respect to the substrate stage. This may be done with an image sensor, such as a transmission image sensor (TIS), as will be known to a person skilled in the art. A TIS measurement is performed by imaging a first alignment pattern (mask alignment mark) provided on the reticle through the projection system (lens) to a second alignment pattern provided on the substrate stage. The alignment patterns may include a number of isolated lines. Inside the substrate stage, behind the second alignment pattern a light sensitive sensor is provided, e.g. a diode, that measures the light intensity of the imaged first alignment pattern. When the projected image of the first alignment pattern exactly matches the second alignment pattern, the sensor measures a maximum intensity. The substrate stage is now moved in the X- and Y-directions on different Z-levels, while the sensor measures the intensity. Therefore, the TIS is actually an aerial image sensor, in which multiple scanning slits probe the aerial image of isolated lines. Based on these measurements, an optimal relative position of the substrate stage can be determined. A typical TIS sensor will be explained in further detail below with reference to FIG. 14. It will be understood that instead of a transmission image sensor, also a reflective image sensor may be used. In this case the second alignment pattern provided on the substrate stage is reflective, and the light sensitive sensor is not positioned inside the wafer stage. Therefore it will be understood that although the text refers to transmission image sensors, this may in general be any type of image sensor.

SUMMARY OF THE INVENTION

According to an embodiment of the present invention, a method of generating a photolithography patterning device for transferring a pattern formed in the patterning device onto a substrate utilizing a lithographic projection apparatus includes defining features within the pattern formed in the patterning device, wherein the features have dimensions and orientations chosen to create a desired image on the substrate during pattern transfer; calculating an effective shadow angle of the radiation on the defined features for a plurality of points on the patterning device; and adjusting the defined features to compensate the desired image for displacement and dimension errors based on the calculated effective shadow angles.

According to another embodiment of the present invention, the defined features are adjusted to compensate the desired image for displacement and dimension errors correlated to the position of the features within an exposure slit during pattern transfer.

According to an embodiment a computer program to control a computer including a recording medium readable by the computer and codes recorded on the recording medium and executable by the computer to direct the computer to generate an adjustment model for use in generating a patterning device for optically transferring a pattern formed in the patterning device onto a substrate using a lithographic projection apparatus, wherein the generation of the adjustment model includes analyzing a representation of features, wherein the features have dimensions and orientations chosen to create a desired image on the substrate during pattern transfer; calculating an effective shadow angle of the radiation on the defined features for a plurality of points on the patterning device; and adjusting the defined features to compensate the desired image for displacement and dimension errors based on the calculated effective shadow angle.

In another embodiment, the computer program is arranged to adjust the features to compensate the desired image for displacement and dimension errors correlated to the position of the features within the exposure slit during pattern transfer.

In yet another embodiment, a patterning device for transferring a pattern formed in the patterning device onto a substrate utilizing a lithographic projection apparatus, wherein the patterning device is manufactured by the methods described above.

In a further embodiment, a method of determining the position of a target image on or proximate a substrate in a lithographic projection apparatus, wherein the target image is formed by features on a patterning device, comprises measuring the position of the target image on or proximate the substrate; and adjusting the measured position of the target image to compensate for displacement and dimension errors introduced by an effective shadow angle of the radiation on the features of the patterning device during pattern transfer.

The method of determining the position of the target image may also include adjusting the measured position of the target image to compensate for displacement and dimension errors correlated to the position of the features on the patterning device within an exposure slit during pattern transfer.

Furthermore, in another embodiment, a measurement device for determining a position of a target image on or proximate a substrate in a lithographic projection apparatus, wherein the target image is formed by features on a patterning device, is provided wherein the measurement device includes a detector configured to measure the position of the target image on or proximate the substrate, wherein the detector compensates the measured position of the target image for displacement and dimension errors introduced by an effective shadow angle of the radiation on the features of the patterning device during pattern transfer.

The detector may also be configured and arranged to measure the position of the target image on or proximate the substrate, wherein the detector compensates the measured position of the target image for displacement and dimension errors correlated to the position of the features on the patterning device within an exposure slit during pattern transfer.

Finally, a lithographic projection apparatus, is provided including an illumination system configured to condition a beam of radiation; a support configured to support a patterning device, the patterning device configured to pattern the beam of radiation according to a desired pattern; a substrate table configured to hold a substrate; a projection system configured to project the patterned beam of radiation onto a target portion of a substrate; and a measurement device configured to determine a position of a target image on or proximate the substrate in a lithographic projection apparatus, wherein the target image is formed by features on the patterning device, the measurement device including a detector configured to measure the position of the target image on or proximate the substrate, wherein the detector compensates the measured position of the target image for displacement and dimension errors introduced by an effective shadow angle of the beam of radiation on the features of the patterning device during pattern transfer.

The measurement device in the lithographic projection apparatus may also be configured to determine a position of a target image on or proximate the substrate, wherein the target image is formed by features on the patterning device, the measurement device including a detector configured and arranged to measure the position of the target image on or proximate the substrate, wherein the detector compensates the measured position of the target image for displacement and dimension errors correlated to the position of the features on the patterning device within an exposure slit during pattern transfer.

According to another embodiment of the present invention, a patterning device for transferring a pattern formed in the patterning device onto a substrate utilizing a lithographic projection apparatus includes an absorber layer having a predefined structure, wherein the absorber layer is made of at least one of glass and glass ceramic.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
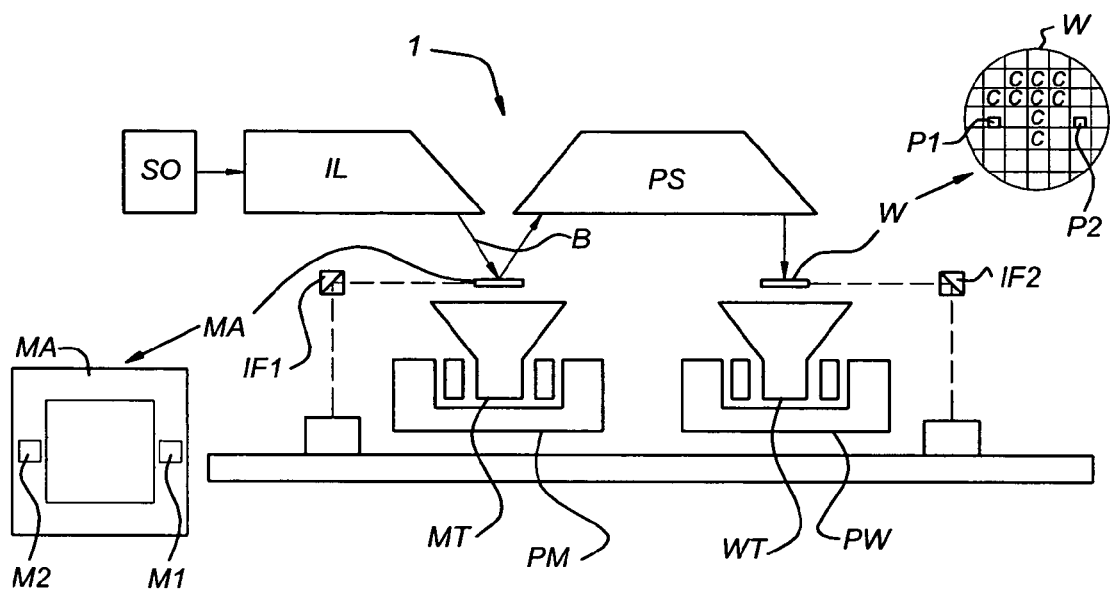
FIG. 1 depicts a lithographic apparatus according to an embodiment of the present invention.

FIG. 1 schematically depicts a lithographic apparatus according to an embodiment of the present invention. The apparatus includes an illuminator IL configured to condition a radiation beam B (e.g. UV radiation or DUV radiation), and further configured to receive radiation from a source SO. A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection system) PS is configured to project a pattern imparted to the radiation beam B by patterning device MA onto a target portion C (e.g. including one or more dies) of the substrate W.

The division of the radiation path before the patterning device into a source SO and illuminator IL may be arbitrary. The division be related to technical features or it can be related to the fact that parts and units are supplied by different manufacturers. For example, the source SO and lithographic apparatus may be supplied by different manufacturers (as is currently the practice in the case for laser sources) or the source SO may be integrated within the lithographic apparatus (as is currently the practice for UV systems with a mercury lamp). For convenience, the term "illumination system" will be used to describe the collection of parts and units disposed in the optical path before the patterning device. In the apparatus of FIG. 1, the illumination system would thus include the source SO and the illuminator IL.

The illumination system may include various types of optical components, such as refractive, reflective, magnetic, electromagnetic, electrostatic or other types of optical components, or any combination thereof, to direct, shape, or control radiation.

In a lithographic apparatus, the illumination system may generate an illumination pupil which is matched to the structures on the patterning device (e.g. lines or contact holes) which are to be projected. The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator IL may be used to condition the radiation beam B, to have a desired uniformity and intensity distribution in its cross-section.

The support MT supports, e.g. bears the weight of, the patterning device MA. It holds the patterning device MA in a manner that depends on the orientation of the patterning device MA, the design of the lithographic apparatus, and other conditions, such as for example whether or not the patterning device is held in a vacuum environment. The support can use mechanical, vacuum, electrostatic or other clamping techniques to hold the patterning device. The support MT may be a frame or a table, for example, which may be fixed or movable as required. The support MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a programmable mirror array of a type as referred to above, or employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture NA of projection systems. The term "immersion" as used herein does not mean that a structure, such as a substrate, must be submerged in liquid, but rather only means that liquid is located between, for example, the projection system and the substrate during exposure.

Referring to FIG. 1, the illuminator IL receives radiation from a radiation source SO. As already mentioned, the source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width, in the non-scanning direction, of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
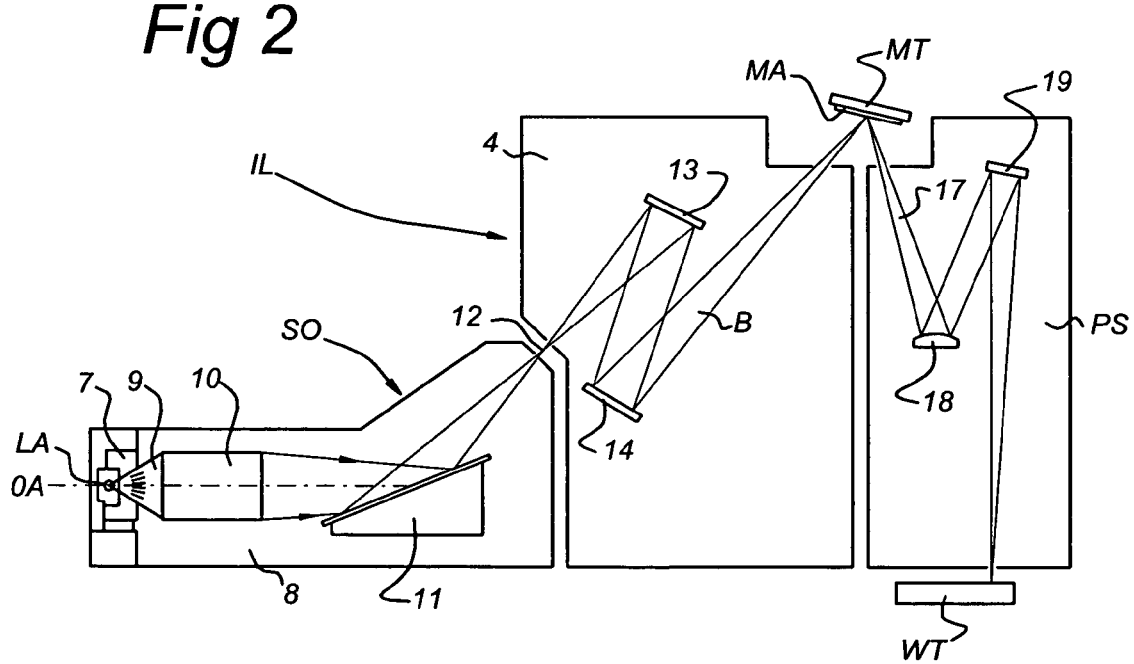
FIG. 2 depicts a side view of the lithographic apparatus of FIG. 1.

FIG. 2 shows more details of the lithographic apparatus, in side view, suitable for use with radiation in the EUV range. The source SO is provided with a radiation source LA which may employ a gas or vapor, such as for example Xe gas or Li vapor in which a very hot discharge plasma is created so as to emit radiation in the EUV range of the electromagnetic radiation spectrum. The discharge plasma is created by causing a partially ionized plasma of an electrical discharge to collapse onto the optical axis OA. Partial pressures of 0.1 mbar of Xe, Li vapor or any other suitable gas or vapor may be required for efficient generation of the radiation. The radiation emitted by radiation source LA is passed from a radiation source chamber 7 into a collector chamber 8 via a gas barrier or foil trap 9.

The gas barrier structure includes a channel structure such as, for instance, described in detail in U.S. Pat. Nos. 6,614,505 and 6,359,969, which are incorporated herein by reference.

The collector chamber 8 includes a radiation collector 10 which is formed, for example, by a grazing incidence collector. Radiation passed by collector 10 is reflected from a grating spectral purity filter 11 to be focused in a virtual source point 12 at an aperture in the collector chamber 8. From chamber 8, the radiation beam B is reflected in illumination system IL via normal incidence reflectors 13, 14 onto the mask MA positioned on the mask table MT. A patterned beam 17 is formed which is imaged by projection system PS via reflective elements 18, 19 onto the substrate table WT. More elements than shown may generally be present in the illumination system IL and projection system PS.

Figure 3A:
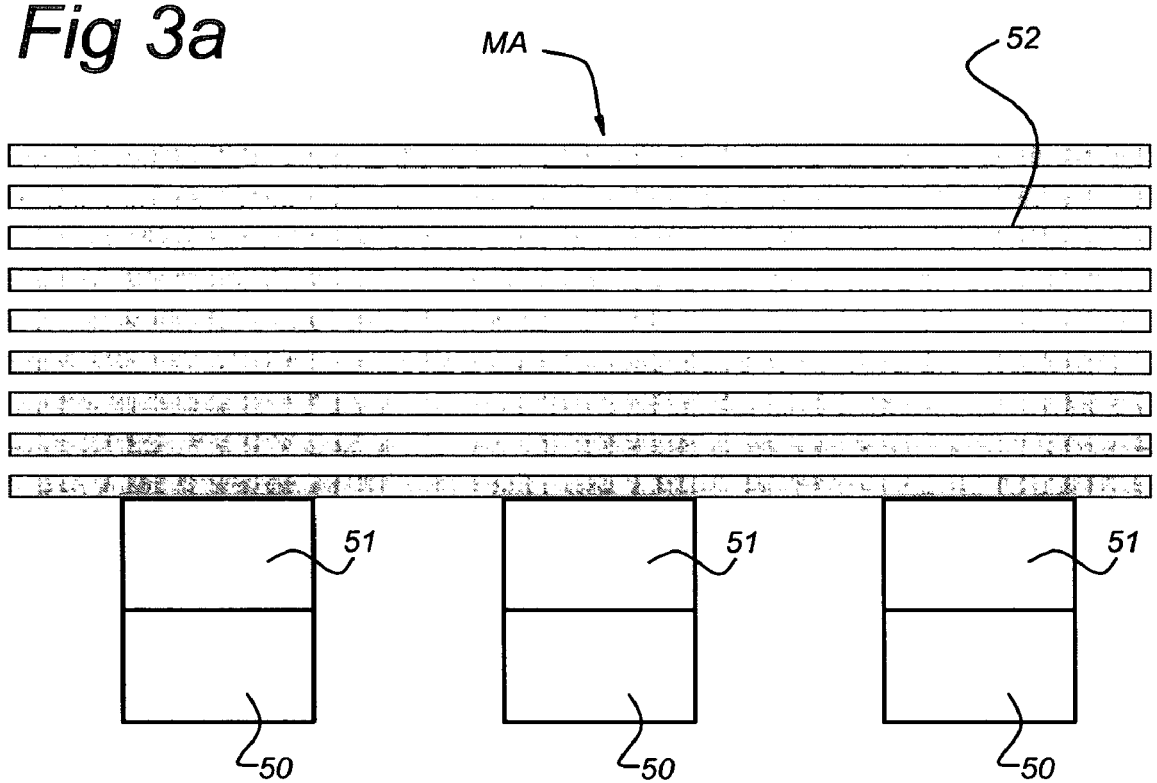
FIGS. 3a and 3b depict patterning devices according to embodiments of the present invention.

FIG. 3a shows a construction of the mask MA suitable for EUV wavelengths. The mask MA includes a patterned absorber layer 50 and a buffer layer 51 on top of a multilayer stack 52. The multilayer stack may include 40 or more layers of, for example Mo/Si or Mo/Be, to create a reflective surface for EUV radiation. The absorber layer 50, for example Cr or TaN or TaBN, is chosen to strongly absorb the radiation beam B and the combination of the patterned absorber layer 50 and the reflective multilayer stack forms the mask MA. The buffer layer 51 is used as an etch stop during mask fabrication, to prevent the etching of the multilayer stack 52 during the etching of the absorber layer 50. Examples of suitable materials for buffer layers are $SiO_2$, $SiO_3$ and Cr.

Figure 3B:
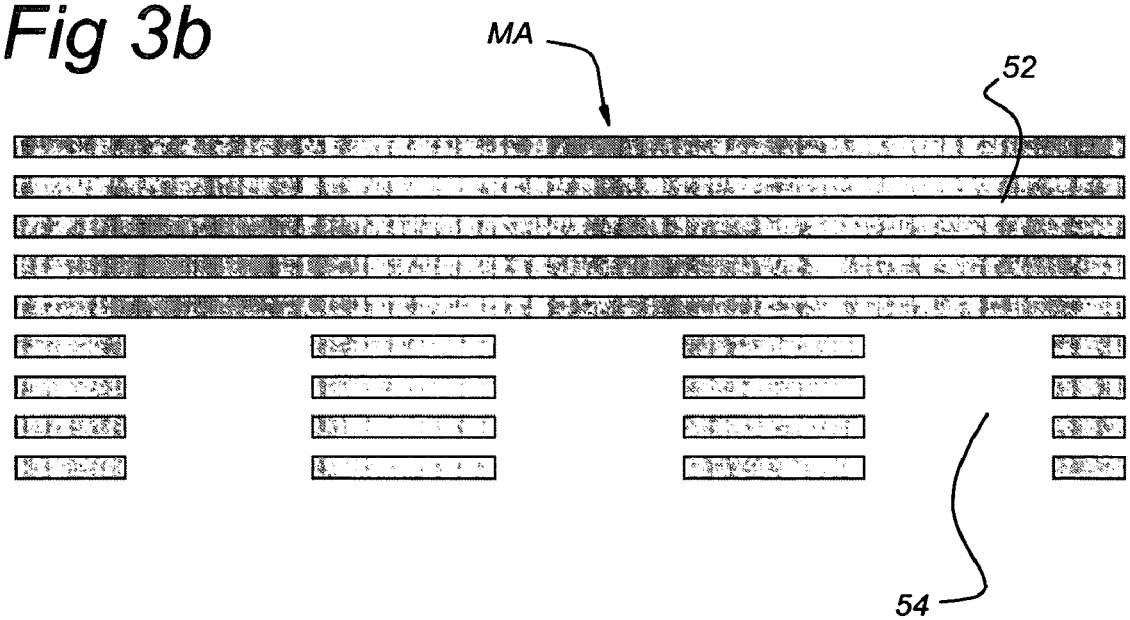

FIG. 3b shows another possible mask MA construction. Here a multilayer stack 52 reflective for EUV radiation is selectively etched to create troughs 54. Because the reflection from the multilayer 52 is dependent upon constructive reflection, damaging the multilayer 52 by etching causes the EUV radiation to be absorbed in the areas of the troughs 54 instead of reflected. Here the combination of reflective and absorbent areas forms the mask MA.

Using the mask and apparatus parameters, a model may be constructed to analyze the interaction between features on the mask and the image projected onto the substrate.

Figure 4:
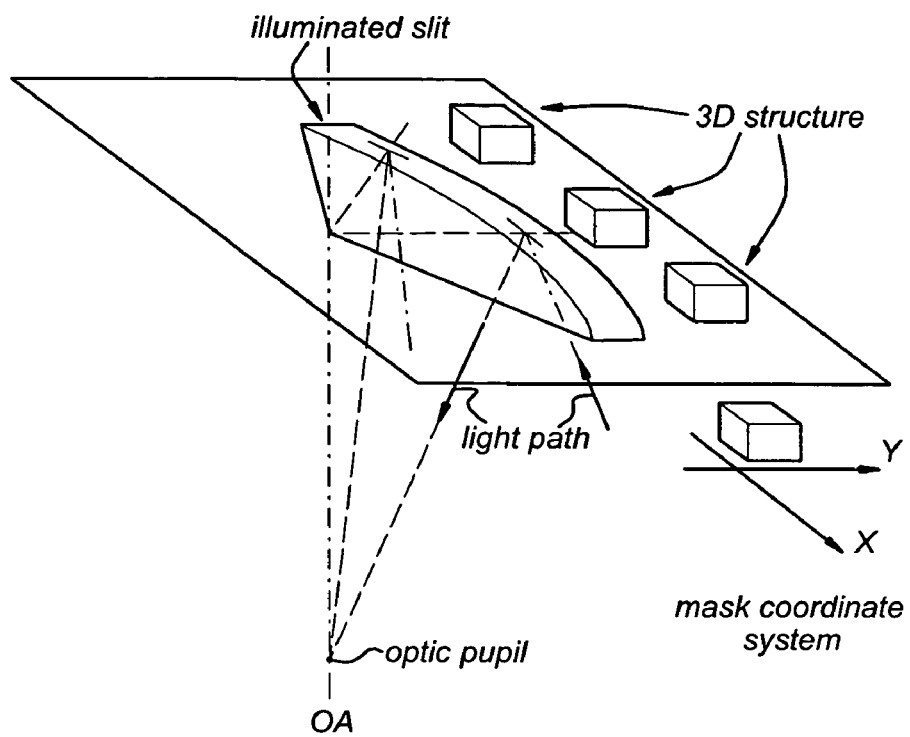
FIG. 4 depicts the condition of a homocentric pupil at mask level, where the centre of a curved slit lies on the optical axis.

At EUV wavelengths, for example 13.5 nm, reflective optics with a multi-layer coating and a non-zero angle of incidence (AOI) are required. Additionally, for large-field lithographic scanner systems, the optic is off-axis which means that the radiation beam B incident on the mask MA forms a curved slit. Although different designs of an off-axis optic are possible, the common characteristic of most designs is a homocentric optic pupil, see FIG. 4, where all chief rays are at one height on the optical axis OA. In other words, the light path in all points in the ring-field pass through the same optic pupil. FIG. 4 depicts this condition at the mask MA level, where the centre of the curved slit lies on the optical axis OA. For any radius of the slit, see FIG. 5, all incoming light has the same angle of incidence.

Although the mask coordinate system is Cartesian, the system in combination with the circular slit is best described in a polar coordinate system.

Figure 5:
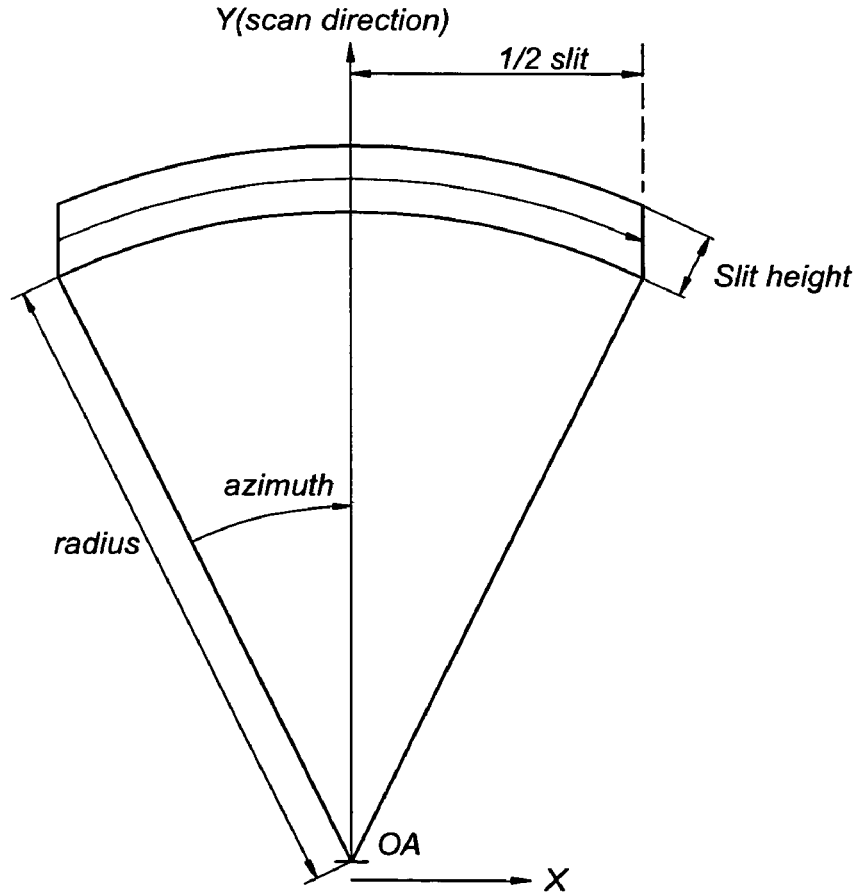
FIG. 5 depicts an example of a slit described by a radius and an azimuth angle.

Due to the homocentric pupil and the off-axis position of the slit, a field position can be described by a radius and an azimuth angle, as illustrated in FIG. 5. The maximum azimuth at the border can be designed up to about 30°. The height of the slit gives rise to a slight angle variation from the smallest to the largest illuminated field radius. In the case of a lithographic step-and-scan apparatus, the scan integrates over the slit height eliminating the angle variation, leaving one effective angle for all azimuths. This effective angle is referred to as the chief ray angle of incidence (CRAO) and has a typical value of 6°.

Figure 6:
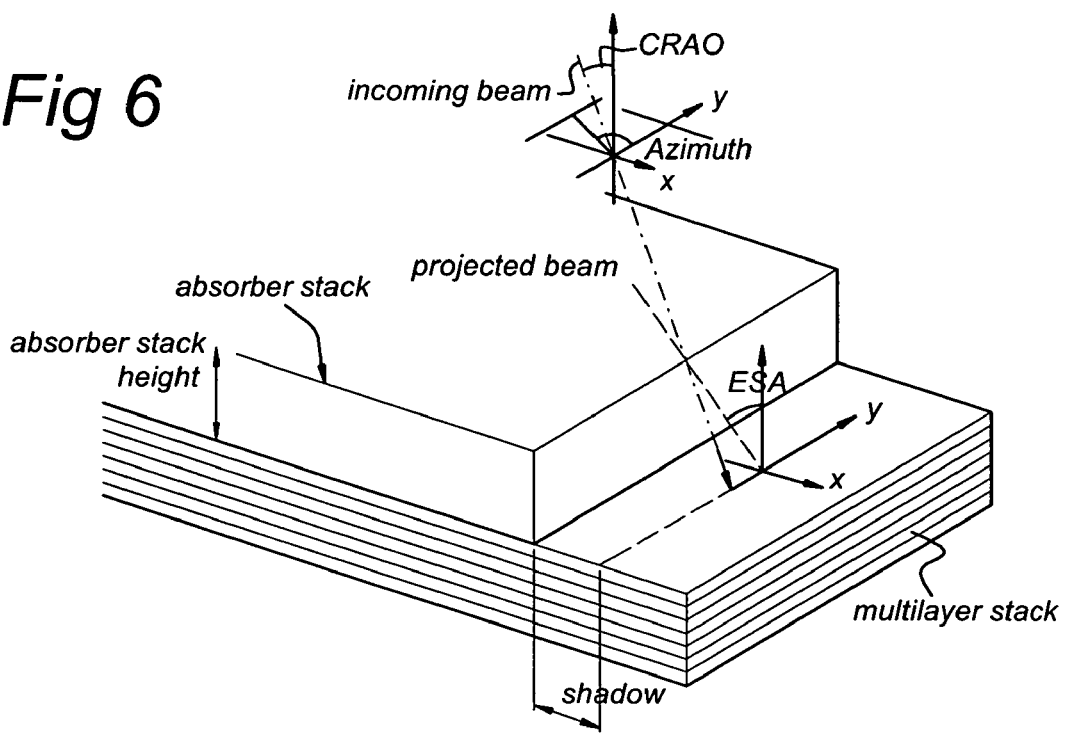
FIG. 6 depicts illumination of a mask structure creating a shadow.
Figure 7A:
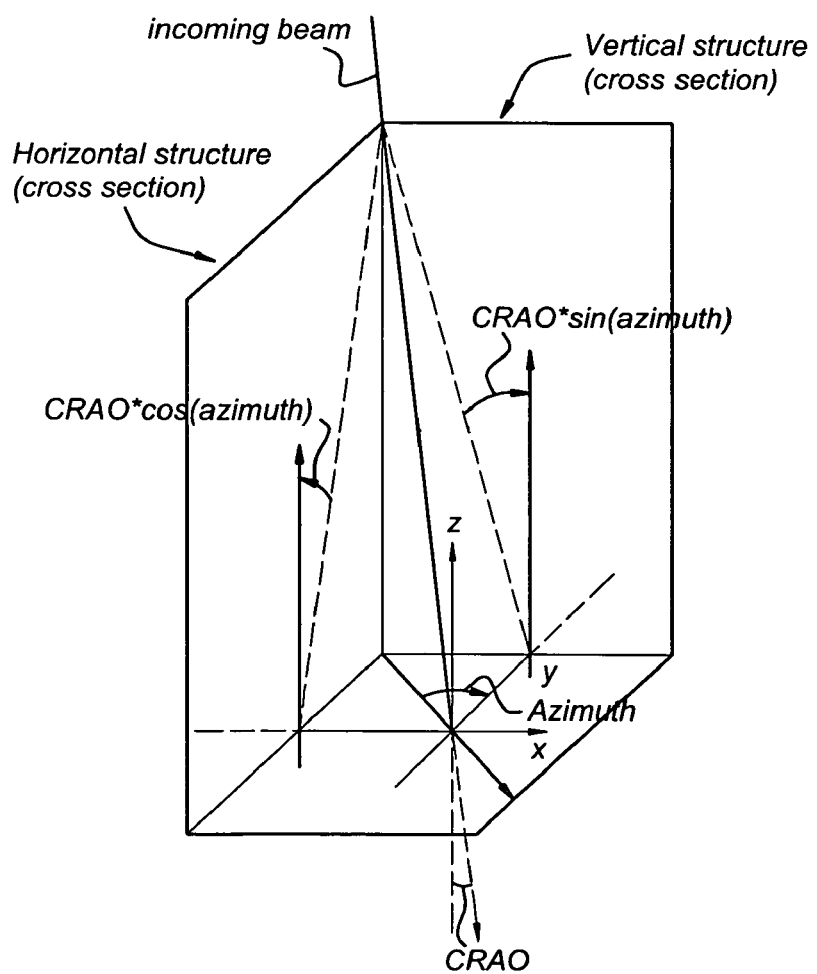
FIGS. 7a and 7b depict the effective shadow projection.
Figure 7B:
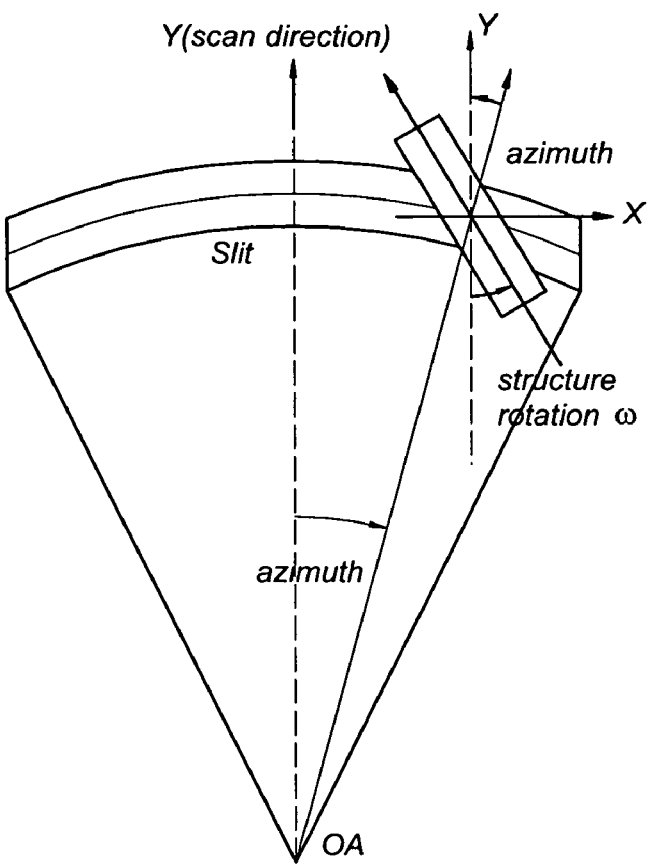

As previously mentioned, the mask structures include absorber stacks having a particular absorber stack height, see FIG. 6, and the chief angle of incidence is unequal to zero. Therefore, an illumination of a mask structure creates a shadow, which is illustrated in FIG. 6. FIG. 6 also shows a Projected beam representing the part of the beam characterizing a plane interacting with the pattern of the mask MA. Since the structures on the mask MA are oriented in a Cartesian coordinate system but the plane of incidence follows the slit radius, the shadow at the structure changes with the structure orientation and the position inside the slit. This effective shadow projection is shown in FIGS. 7*a* and 7*b*. In FIG. 7*a*, the projection of the chief ray to a vertical and to a horizontal side wall of a structure are shown, which are equal to a projection to the sagittal and a meridional plane. In mask coordinates, the vertical line is along the Y-direction equal to the scan direction and a horizontal line is parallel to the X-direction and perpendicular to the scan direction. In FIG. 7*b*, the light beam is shown as a projection at the mask MA layer versus a structure on a slit position and rotated versus the beam, for example 45°.

The effective shadow angle (ESA) can be expressed by:

$$ESA = CRAO \cdot \cos(azimuth + \omega) \quad (1)$$

wherein CRAO is the angle defined by the center radius of the slit, azimuth defines a current position inside the slit, and c is the rotation of the structure according to a mask coordinate system. Using a standard mask coordinate system where the X-direction (see FIG. 4) is perpendicular to the slit and therefore to the scan direction, a horizontal line (i.e. a line in the X-direction) would have in the equation (1) a value of 0° and a vertical line a value of 90°. At a vertical line and the CRAO equal to 6°, the ESA along the azimuth shows a range from 3.0° linearly down to −3.0°. For a horizontal line, the ESA shows a quadratic behavior around the CRAO with two minima near 5.0° left and right of the slit. An overview of the ESA for different structure orientations co is given in FIG. 8.

Figure 9A:
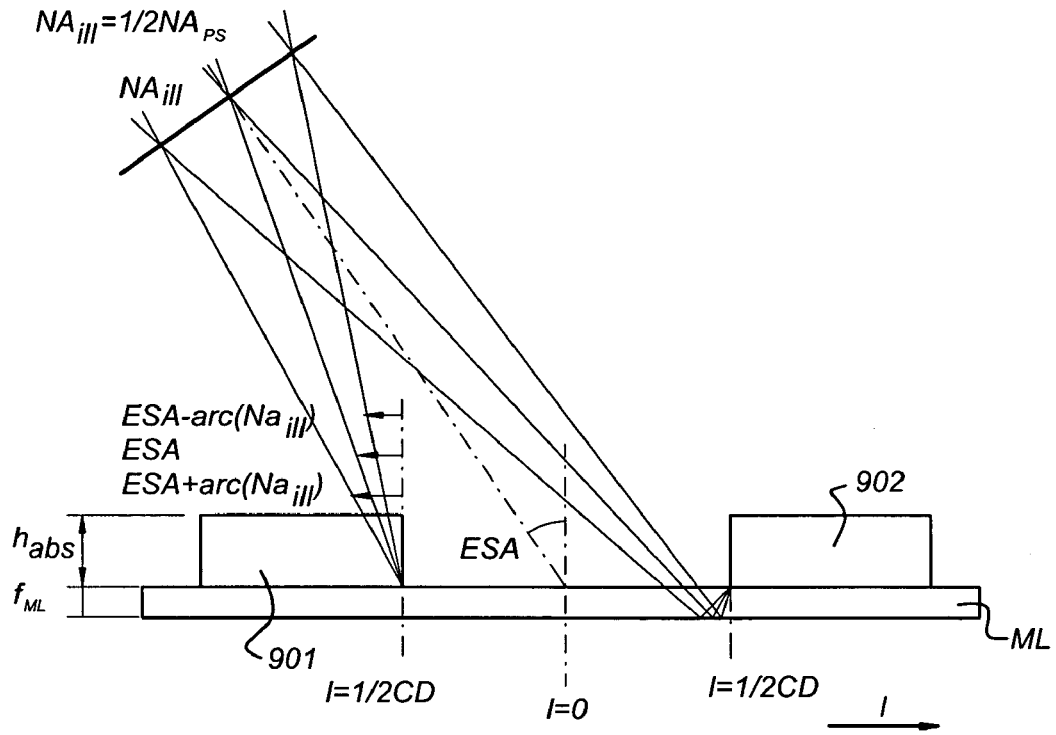
FIGS. 9a and 9b depict entrance and exit pupils looking from a mask.
Figure 9B:
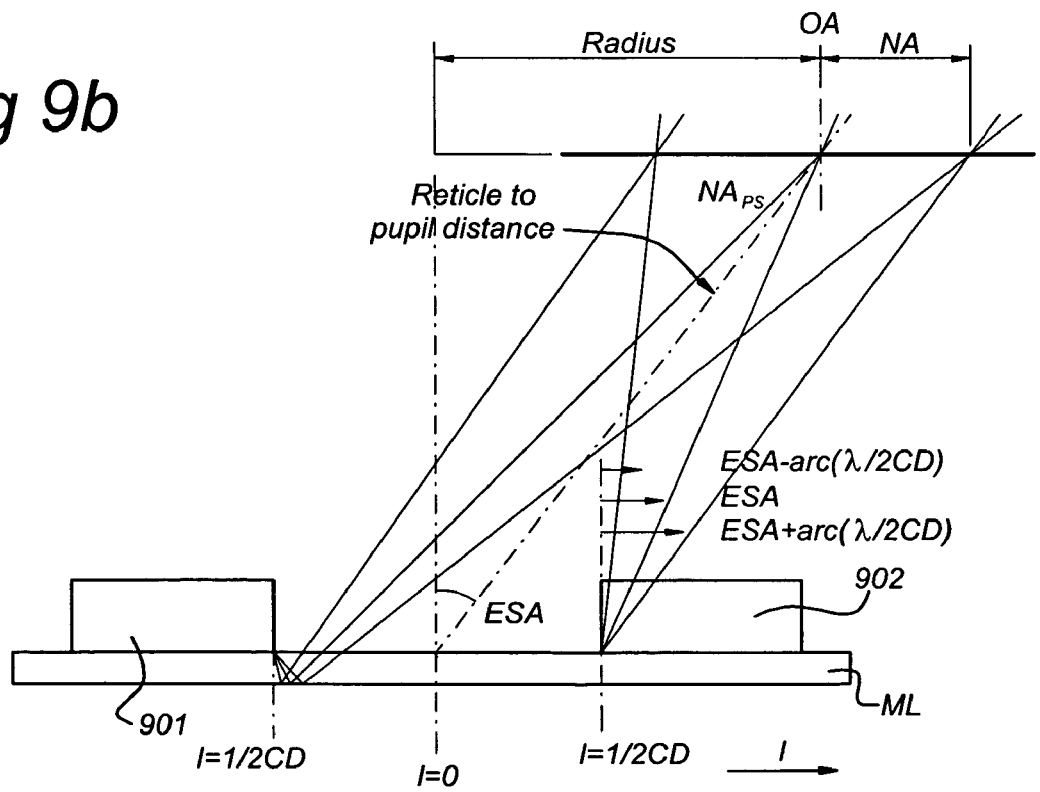

To better understand the illumination and the related angle distribution along the light cone, it is helpful to make a step from the view used in FIG. 4 to a cross-section where the mask MA is an optical element between two pupils. The homocentric pupil of the projection system PS and the mask MA are oriented parallel to each other. The pupil formed by the illumination system, though, is not parallel to the mask. A sketch of the entrance and exit pupils looking from the mask MA is shown in FIGS. 9*a* and 9*b*. The mirror function of the mask MA is performed by the multi-layer ML. The 3D character of an absorber layer on the mask MA is depending on a height of structures 901, 902 defining a pattern of the mask MA. FIGS. 9*a* and 9*b* show the boundary rays of the cone and the center ray defined by the ESA at the edges of the structures 901, 902 to illustrate the different conditions regarding the entrance and exit pupils. The illumination cone for every field point is identical but with the center varying for the different field positions. The maximum angles at the exit pupil are defined by diffraction that is dependent on the structure size.

Figure 10:
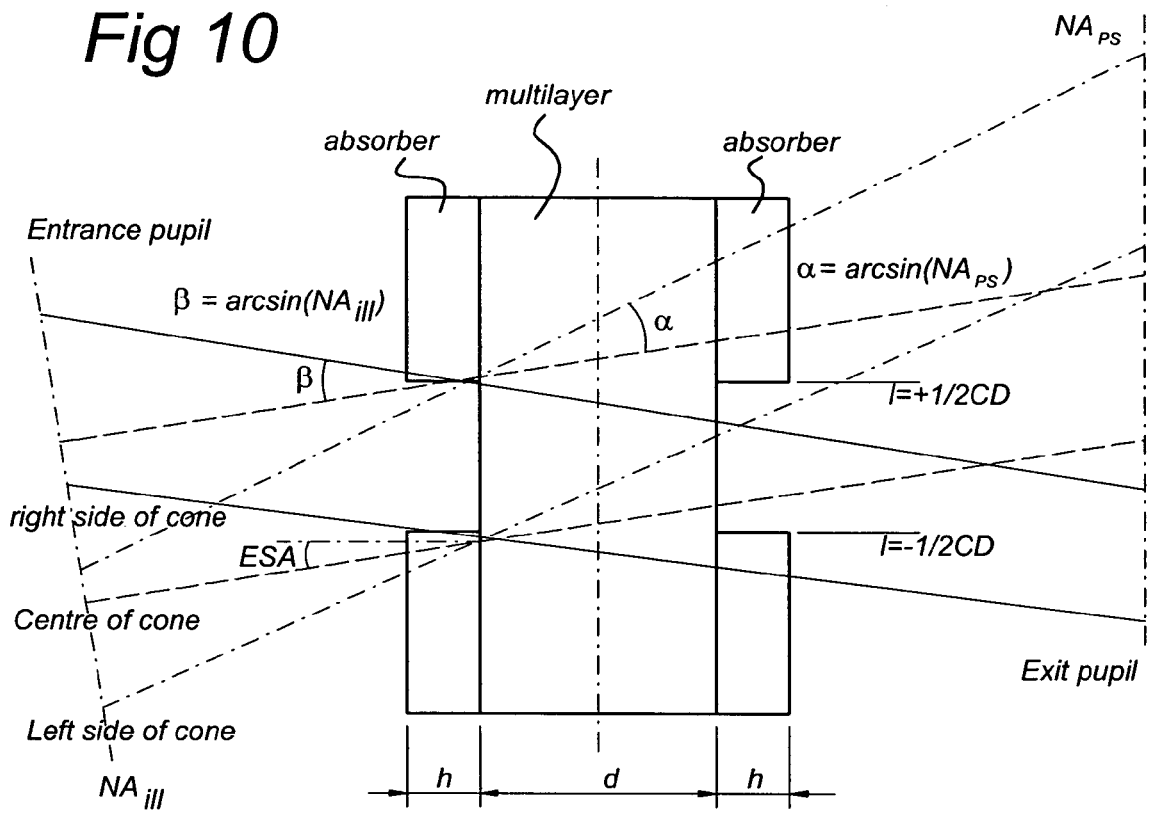
FIG. 10 depicts how a change of the effective shadow angle changes the interaction of a light with an absorber.

To ease understanding, the mask reflection property is transferred to a transmission equivalent. FIG. 10 illustrates how a change of the ESA changes the interaction of the light with the absorber. In FIG. 10, two boundary cases, light cone hitting the absorber edges at the foot and at the entrance side, are shown. The entrance angle on the left side of the absorber (not shown in FIG. 10) is defined by the illumination aperture $NA_{ill}$ tilted by the ESA. At the exit side (i.e. right side in FIG. 10), the angles are defined by the diffraction angle, the ESA and the illumination aperture $NA_{ill}$. The multi-layer ML is included with the vertex layer (i.e. with the virtual focus), where the vertex layer defines the path length through the absorber and therefore the exit point of the light.

Figure 8:
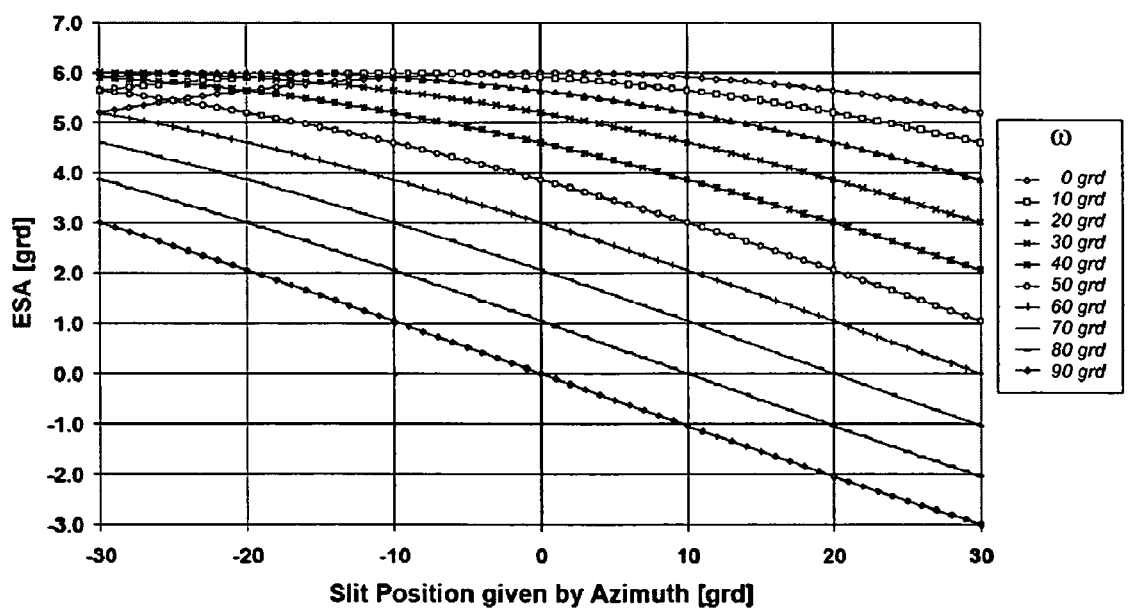
FIG. 8 depicts the effective shadow angle for different structure orientations.

Above, the illumination and slit geometry, the mask and system coordinate systems, the effective shadow created by mask structures, and the mask absorber geometry have been introduced. As illustrated in FIG. 8, the variation of the ESA is dependent on the structure orientation and the position inside the slit. The shadow created by a structure is directly related to the absorber height and the effective shadow angle ESA, see for example FIG. 6. This shadow decreases the Critical Distance (CD) on the mask MA and thus on the substrate W. Therefore, according to an aspect of the invention, a method of generating a photolithography patterning device, e.g. a mask, for transferring a pattern formed in the patterning device onto a substrate utilizing a lithographic projection apparatus, is provided wherein the features of the pattern of the mask are adjusted to compensate a desired image for displacement and dimension errors introduced by the effective shadow angle of the radiation on the features during pattern transfer. The features of the pattern can for example be adjusted by adjusting the size or the position of the features.

If the absorber is a metal, such as TaN or Cr the absorber will not be fully opaque to EUV, and more or less EUV light travels through the absorber depending on the chosen material and the thickness, see also FIGS. 9*a* and 9*b*. The absorber material is characterized by the phase shift 6 and the intensity damping. The thickness of the absorber on current EUV masks is in the order of 100 nm or below. Additionally, the different lengths of the light path through the absorber are defined by the angles of the light cone and the ESA as shown in the FIGS. 9*a* and 9*b*.

Figure 11:
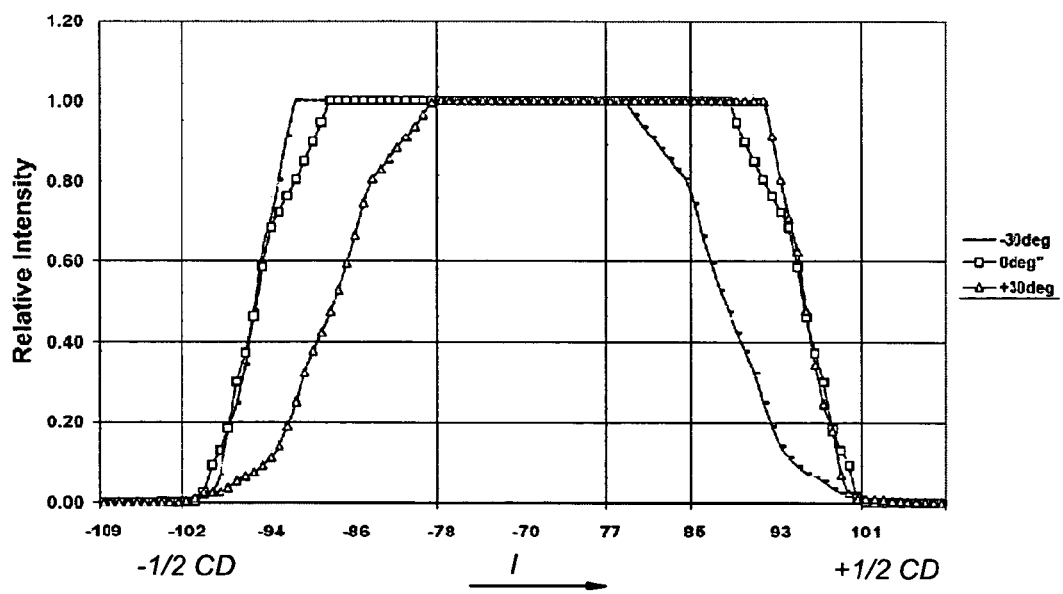
FIG. 11 depicts an intensity distribution of a dense line for three different positions inside the slit.

To illustrate this light-mask-system interaction, the calculation for an EUV system for a light cone coming from the illuminator IL with an angle equivalent to a NA=0.03125 will be performed. As a first example, the average intensity over all different light paths is calculated for a vertical line that is 200 nm at mask level or 50 nm at the wafer for the 4× system. The average is an approximation assuming incoherent illumination and small angle variation. FIG. 11 shows the intensity distribution of the structure as a function of position 1 along the distance between the two structures 901, 902, see FIG. 9*a*, for three different positions (i.e. three different azimuths) inside the slit. The positions are on the left (azimuth=−30°), on the center (azimuth=0°) and on the right side (azimuth=30°) of the slit. For the calculation it was assumed that a virtual focus of the reflected light inside the multi-layer ML is 80 nm beneath the top of the multi-layer ML.

Figure 12A:
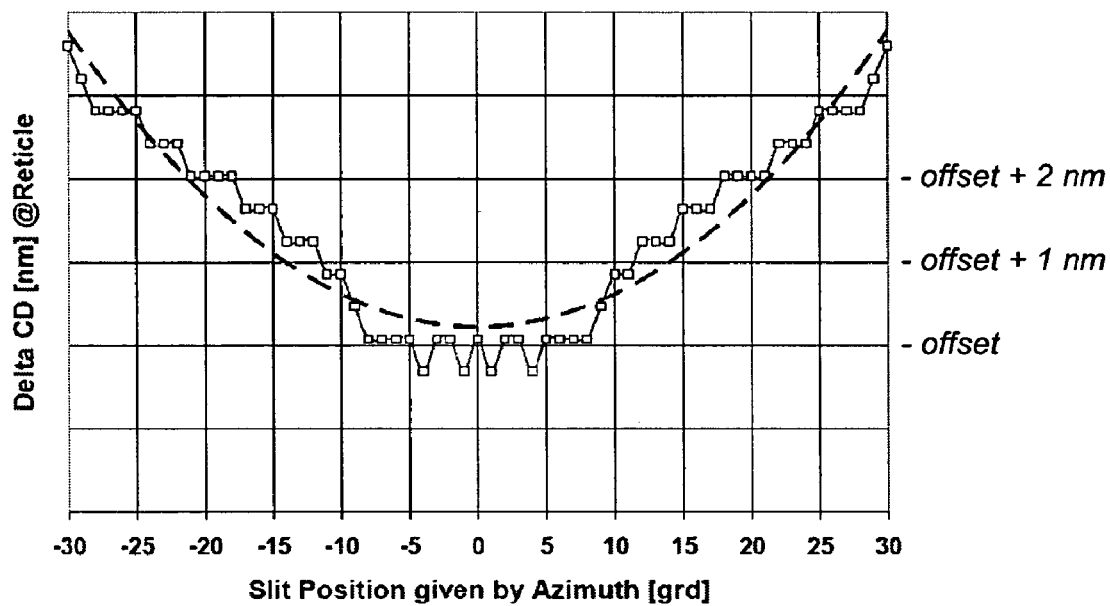
FIG. 12a depicts the trend of a critical dimension change as a function of slit position for a vertical oriented isolated line.

In FIG. 11 two effects of the illumination-mask-system interaction are visible. First, the center of gravity of the lines shifts with the azimuth, which for system performance becomes a structure and slit position overlay term. This shift is linear from the left-side to the right-side, and is on the order of 5 nm at mask level for the given example. Second, the position at azimuth 0° (slit center) contains more energy relative to the structure compared to the extreme positions of the slit. This means that there is an ESA dependent variation of the transferred light through a pattern. How this transferred light variation creates a CD change at the wafer level depends on whether the line to be imaged is an isolated line or a dense line. The difference between a dense and an isolated line can be explained by understanding the intensity spectrum at the pupil. For an isolated line, the spectrum is assumed to be a continuum. All frequencies up to the pupil cut off are transferred. For large isolated lines (i.e. wide lines) as in the given example of FIGS. 9*a*, 9*b* and 10, the intensity of a pattern on the mask is transferred to the substrate W one-to-one. However for dense lines, the sampling at the pupil is discrete and limited to one, or above 54 nm for a projection optics including a NA of 0.25 and used wavelength of 13.5 nm, to two discrete orders. The discrete sampling means that the form of the intensity curve is not transferred, a pattern infinitely periodically extended is reduced to a sine-pattern, and as shown in FIG. 11, the duty cycle is changed. The duty cycle of a dense line is no longer 1:1 but more like 0.9:1.1 (400 nm pitch and the clear part is degraded by 40 nm). This ratio change can be viewed as a dose variation. Thus, the effect on the CD at the substrate W of this energy variation depends on exposure latitude. Referring again to FIG. 11, one can also see that the effect of the absorber on the edges of a structure is structure-size independent. Shrinking the structure size without an adequate change of the absorber height (or transmission) means that the expected CD change through the slit will be more pronounced. To illustrate this, FIG. 12a shows the trend of CD change for a vertical oriented isolated line (i.e. a line in the Y-direction). In FIG. 12a, calculated values of the CD change (i.e. Delta CD) as a function of the azimuth are indicated by small squares. Through the calculated values a line is fitted shown by the broken line. The maximum CD change, i.e. the offset in FIG. 12a, is in the order of 10 nm at the mask MA.

Figure 12B:
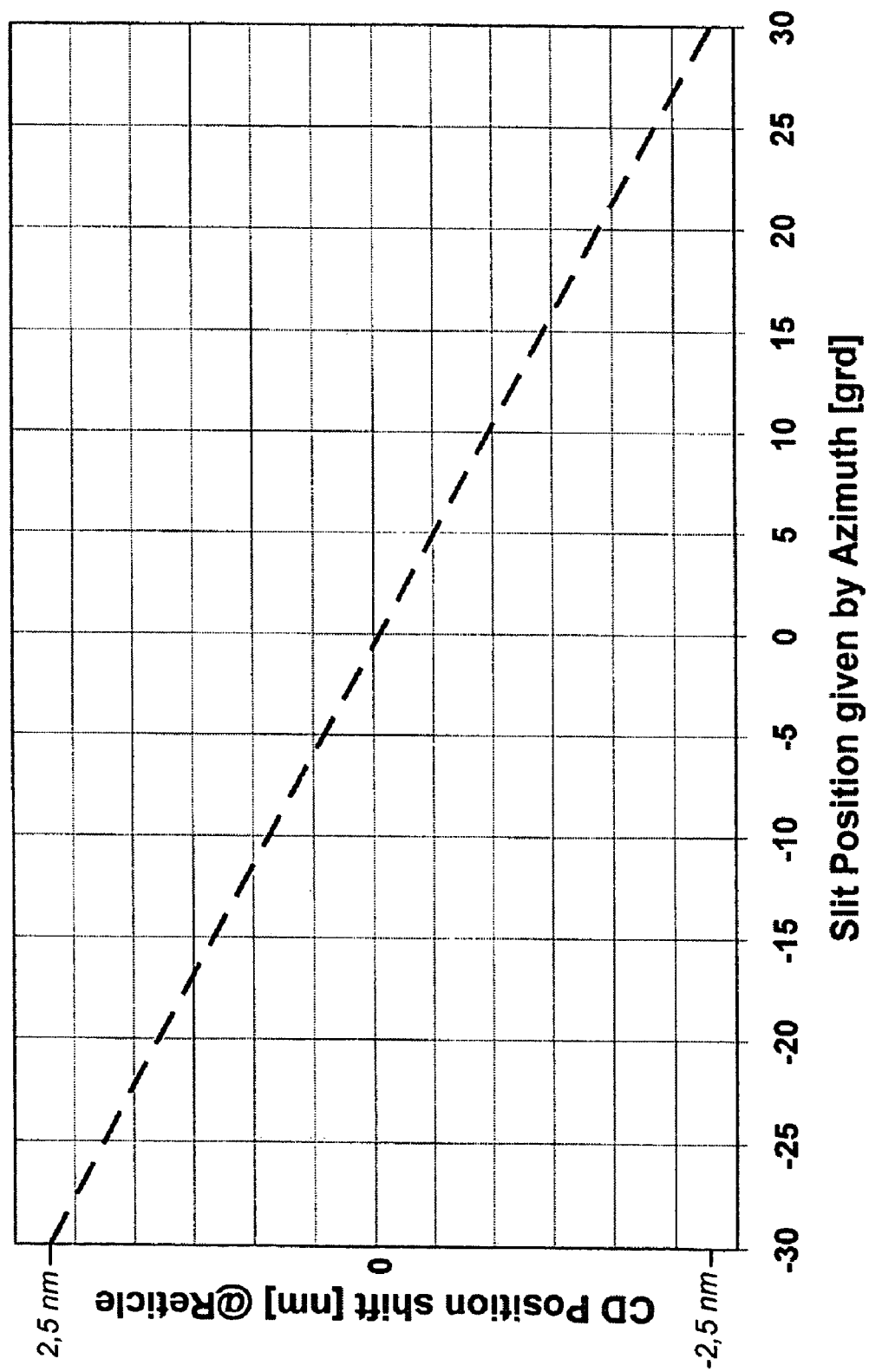
FIG. 12b depicts the trend of a critical dimension position shift as a function of slit position for a vertical line.

FIG. 12b depicts the trend of a shift of the critical dimension position as a function of the slit position for a vertical line with a CD equal to 200 nm. FIG. 12b shows a straight descending line, which indicates that a center of gravity of the CD (this is a position shift to be corrected), is in the order of 5 nm.

Figure 13A:
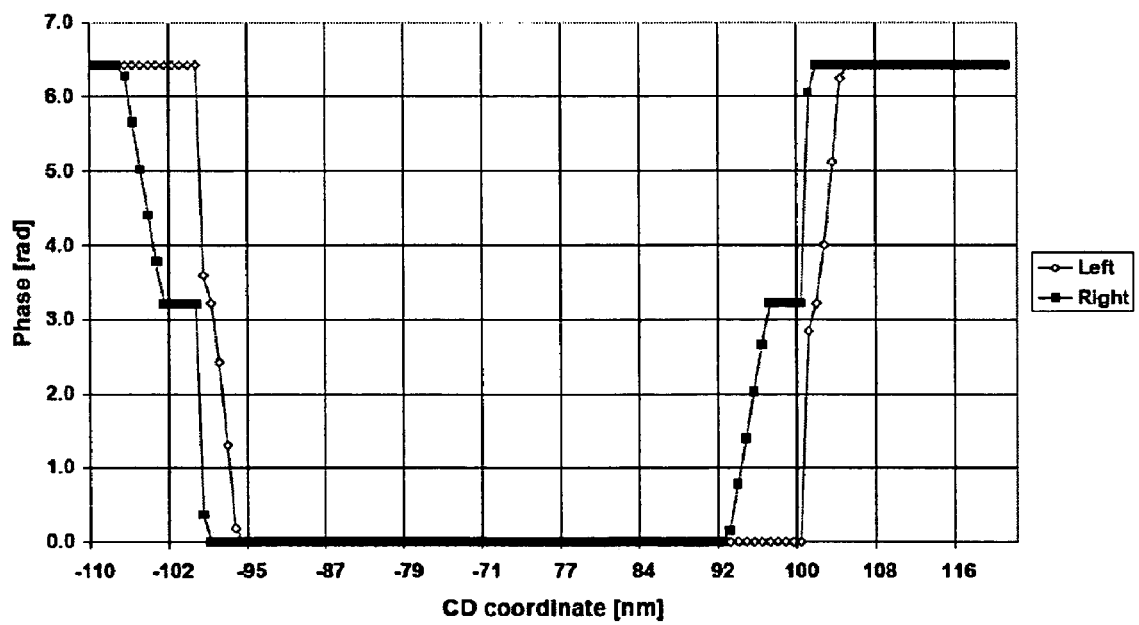
FIGS. 13a, 13b and 13c depict the phase change through the absorber along the slit for the three slit positions.
Figure 13B:
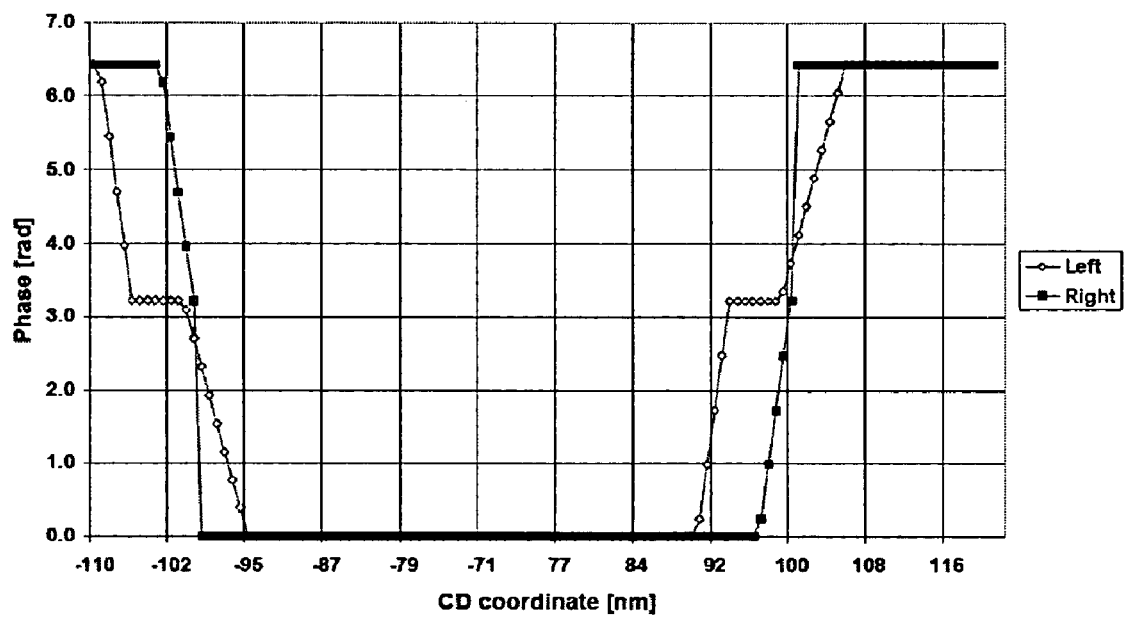
Figure 13C:
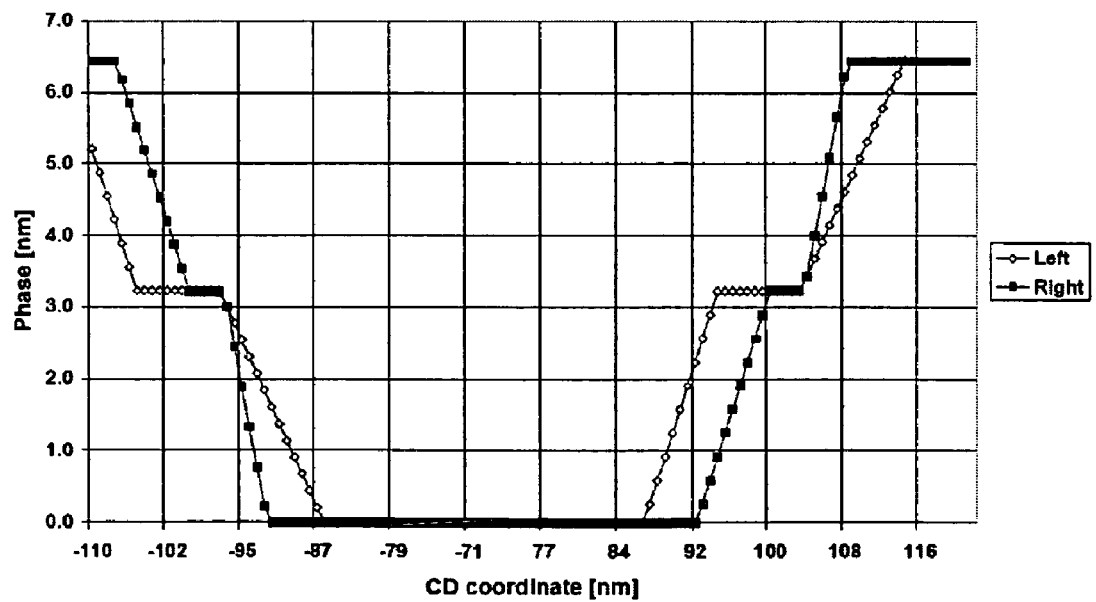

For the phase change through the absorber, a superposition is required in the calculation of the phase for the angles inside the light cone at the entrance and the exit pupil. To visualize the change along the slit for the three slit positions, the phase along the 200 nm line structure is calculated for both maximum angles of the illumination light cone, and is shown in FIGS. 13a to 13c. In FIGS. 13a-13c, the phase of the left side of the light cone (see also FIG. 10) is depicted by white dots, and the phase for the right side of the light cone is depicted by black dots.

The total amount of change in phase of the outgoing light wave is depending on the structure size. For constant absorber thickness and shrinking line width, the phase impact on the light wave will increase. The effect of the phase in terms of pattern transfer is also depending on the amount of energy or intensity, which degrades very rapidly on the edges of a pattern at the same time the phase changes.

As was discussed above, the optic design features of an EUV illumination system, such as the slit geometry or the angle of the incoming light, calls for an adjustment of the mask geometry. The optic design features cause a variation of the structure shadow on the mask MA. This variation is also depending on the amount of transparency of the absorber material used to build the structures on the mask MA. Therefore, according to an embodiment, the features of the mask are adjusted using a thickness of the absorber used to define the features and/or the intensity damping of the absorber.

The variation of the structure shadow can be described by using the effective shadow angle ESA which is slit position and structure orientation dependent. The intensity variation of a structure shows a CD variation and CD position variation along the slit that is structure orientation dependent. Without changing the absorber properties of height and transmission, a shrink of the line width at the mask MA intensifies this dependency. So, to predict the size and position of a final projected image on the substrate W, it will not be sufficient to just know the size and position of the features on the mask, and the reduction of the projection system. An adjustment of the features of the mask MA is favorable before using the mask MA for exposure.

In an embodiment of the present invention, the CD variation and CD position variation is corrected on the mask itself by varying the size and position of the features depending upon their dimensions and their position and orientation they will occupy in the slit when the mask is used for an exposure in the lithographic apparatus. In practice, this is not a restriction on how the features on the mask are projected because the size of the die area on the mask to be projected is always equal to or smaller than the slit length. The die area on the mask can therefore always be positioned so that the slit of radiation is always patterned in the same way by the features of a particular mask. The calculation of the correction required is mostly simply performed based upon the ESA.

A further problem encountered is that of alignment using an image sensor. As already explained above, the alignment of the mask MA with respect to the substrate W may be done in two actions. First the substrate W is aligned with respect to the substrate table WT, and in a second action the mask MA is aligned with respect to the substrate table WT. As a result of these two actions, the relative position of the mask and the substrate is known and can be set in order to ensure desired imaging of the patterning device.

At least some of the embodiments of the present invention described herein may be applied to provide a solution to the problems associated with the second action, i.e. the alignment of the mask MA with respect to the substrate stage WT. Therefore, the sensor that is conventionally used for this, the TIS sensor, is further explained with respect to FIG. 14.

Figure 14:
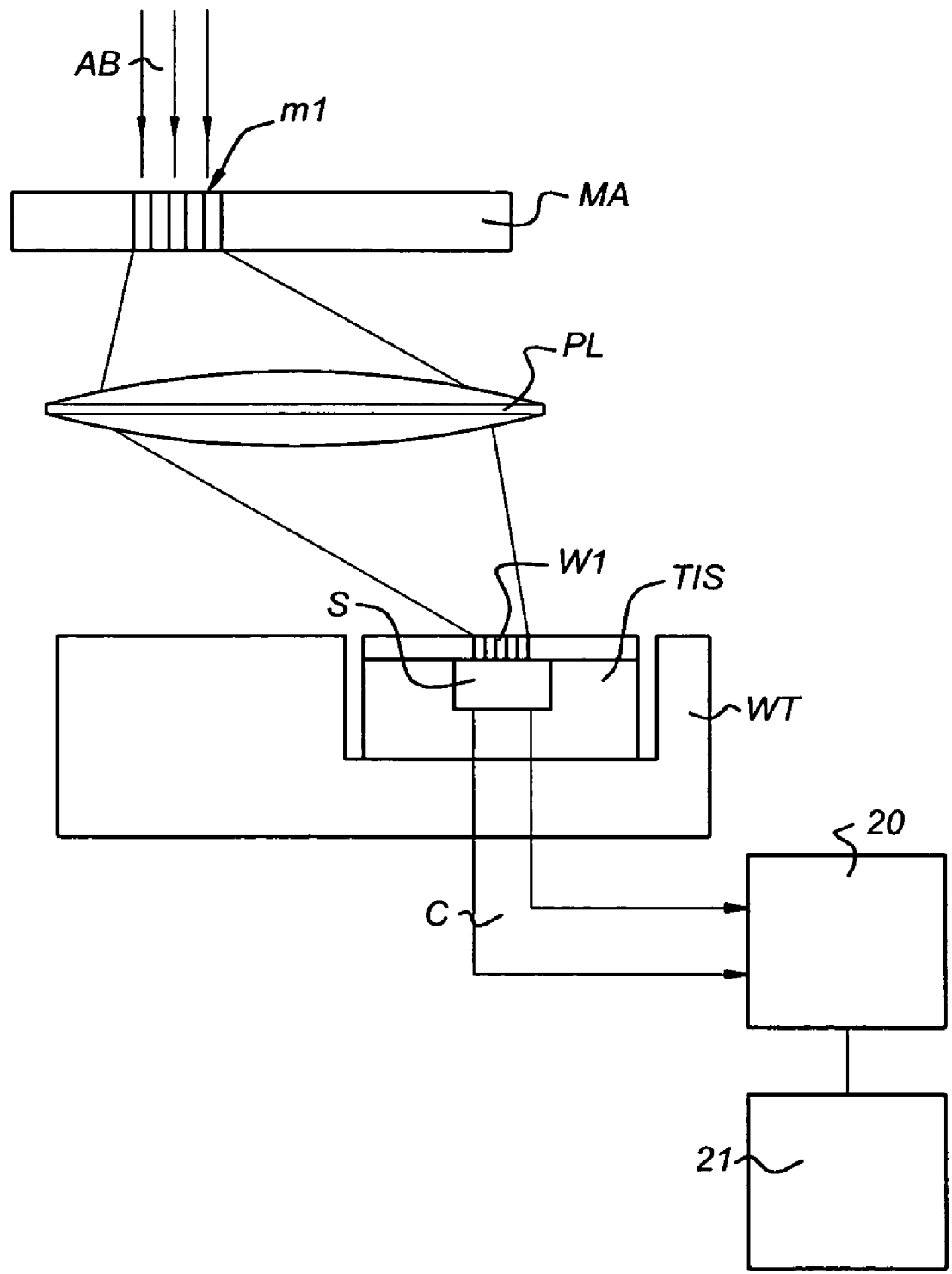
FIG. 14 depicts a transmission image sensor useable with the present invention.

FIG. 14 depicts a simplified, schematic view of a part of a TIS sensor. The projection system PL is depicted here to be of the transmissive type to simplify the explanation and the drawing. FIG. 14 depicts the mask MA provided with a mask alignment marker M1. The figure further shows the substrate table WT and the projection system PL, provided in between the reticle MA and the substrate table WT. The projection system PL is depicted as a single lens, but it should be appreciated that it may also be a plurality of lenses. The projection system PL will, for convenience sake, be referred to as the lens PL.

The substrate table WT includes the TIS sensor, provided with a substrate table alignment marker W1. Behind the alignment marker W1 a light sensitive sensor S is provided, such as a diode. The sensor S may be provided with cabling C for communicating the measured data to a processor 20. The processor 20 is arranged to communicate with a memory device 21. Below, the TIS sensor and the processor 20 are also referred to as detector.

The alignment measurement is carried out by providing an alignment beam AB to the mask alignment marker M1 and imaging the mask alignment marker M1 via the lens PL on the substrate table alignment marker W1. The alignment beam AB preferably originates from the same radiation source SO (not shown in FIG. 14) as used for exposing the substrate W.

The substrate table alignment marker W1 is of a transmissive type and both markers M1, W1 have a predetermined corresponding pattern such that the pattern of the mask alignment marker M1 as projected on the substrate table alignment marker W1 by the lens PL and the pattern of the substrate table alignment mark W1 are matching. This means that a maximum amount of light is transmitted through the substrate table alignment marker W1 if the relative positioning of the reticle MA and the substrate table WT are correct. In that case, the sensor S will sense a maximum amount of light.

The alignment is now performed by moving the substrate table WT in all three directions (X, Y, Z), for instance by making a scanning movement in the X- and Y-directions and performing these scans at different positions in the Z-direction, while constantly measuring the light intensity as received by the sensor S. The movements of the substrate table WT are performed with the positioning device, such as the second positioning device PW as described with reference to FIG. 1 (not shown in FIG. 14). These positioning devices PW are controlled by processor 20.

The position of the substrate table WT where the sensor S measures the maximum amount of light is considered to be the optimum relative position of the substrate table WT with respect to the reticle MA.

The use of image sensor measurements with an off-axis ring-field lithographic apparatus involves a few problems. The first alignment patterns have different features, orientations and dimensions than the features of the patterning structure to be imaged on the substrate. The slit position dependency of the CD size and position means that the projection system may project the alignment pattern on a different location than the features of the patterning structure. Additionally, the CD of the projected first alignment pattern may vary depending on the position in the slit. Either of these may cause an offset in the measured aligned position, in the lateral direction (in the XY plane) as well as in the axial direction (Z-direction).

Additionally, there is a problem with the second alignment pattern. As stated above it is assumed that maximum intensity is measured by the sensor when the first alignment pattern exactly matches the second alignment pattern. However, the features, orientations and dimensions of the first alignment patterns will vary depending on the position in the slit in which the first alignment patterns are positioned.

An alignment sequence usually includes multiple single point alignments. The result of a single point alignment equals an aligned position X, Y and Z. When multiple points are aligned, the rotation can be computed based on the relative positions between the points. Since the measured position differ for different positions, the single point alignment by the image sensor is influenced differently for different slit positions. So, offsets in all parameters may be expected.

Therefore, according to an aspect of the invention, the detector described above is configured and arranged to measure the position of the target image on or proximate the substrate, wherein the detector compensates the measured position of the target image for displacement and dimension errors correlated to the position of the features on the patterning device within the exposure slit during pattern transfer. In this embodiment, the offsets in the alignment parameters are reduced by correcting the alignment patterns on the mask itself by varying the size and position of the features depending upon their dimensions, the position and orientation they will occupy in the slit when the mask is used for an exposure in the lithographic apparatus, and the difference in dimensions and orientations between their features and the features on the patterning structure.

According to an embodiment, the correction of the alignment parameters is performed based upon the ESA.

In another embodiment of the present invention, the measured alignment positions are corrected by calculating the error based upon the positions of the mask alignment marks in the slit, the dimensions and orientation of the mask alignment features and the difference in dimensions and orientation between the features on the patterning device and the mask alignment features.

It may also be desirable to perform some corrections of the feature size on the mask and to also implement corrections during exposure as this gives increased flexibility.

In another embodiment of the present invention, the slit position dependency is reduced by employing a more efficient absorber (e.g. non-conductive material like glass or glass ceramic, which is necessarily free from gassing out dangerous spices—lifetime and contamination aspect of the mask itself and the optic/mirrors). This could be, for example, ZERODUR®, which can be sputtered onto the multilayer surface and etched to create features. Alternatively, it could be grown onto the multilayer and subsequently etched.

According to an aspect, a method of generating a photolithography patterning device for transferring a pattern formed in the patterning device onto a substrate utilizing a lithographic projection apparatus is provided, which includes the defining features within the pattern formed in the device, wherein the features have dimensions and orientations chosen to create a desired image on the substrate during pattern transfer; and adjusting the dimensions of the features to compensate the desired image for displacement and dimension errors introduced by the effective shadow angle of the radiation on the features during pattern transfer or correlated to the position of the features within the exposure slit during pattern transfer. Also measurement device for determining the position of a target image on or proximate a substrate in a lithographic projection apparatus, such as a TIS is provided, wherein the target image is formed by features on a patterning device, includes a detector configured to measure the position of the target image on or proximate the substrate, wherein the detector compensates the measured position of the target image for displacement and dimension errors introduced by the effective shadow angle of the radiation on the features of the patterning device during pattern transfer or correlated to the position of the features within the exposure slit during pattern transfer. Also a lithographic apparatus is provided which includes the measurement device described above.

According to a further aspect, a computer program is provided to control a computer including a recording medium readable by the computer and codes recorded on the recording medium and executable by the computer to direct the computer to generate an adjustment model for use in generating a patterning device for optically transferring a pattern formed in the patterning device onto a substrate using a lithographic projection apparatus, the generation of the adjustment model including analyzing a representation of features, wherein the features have dimensions and orientations chosen to create a desired image on the substrate during pattern transfer, and calculating an effective shadow angle of the radiation on the defined features for a plurality of points on the patterning device; and adjusting the defined features to compensate the desired image for displacement and dimension errors based on the calculated effective shadow angle.

The computer program may also be arranged to adjust the features so as to compensate the desired image for displacement and dimension errors correlated to the position of the features within the exposure slit during pattern transfer.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it should be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the present invention may be practiced otherwise than as described. For example, it should be appreciated that the corrections described above could also be performed when using a non-curved slit. In that case the similar corrections are needed. Furthermore, it should be noted that instead of using a TIS sensor, other kinds of detectors can be used, such as for example a detector based on scattering techniques.

The descriptions above are intended to be illustrative, not limiting. Thus, it will be apparent to one skilled in the art that modifications may be made to the present invention as described without departing from the scope of the claims set out below.

What is claimed is:

1. A method of generating a photolithography patterning device for transferring a pattern formed in the patterning device onto a substrate utilizing a lithographic projection apparatus, the method comprising:
    defining features within the pattern formed in the patterning device, wherein the features have dimensions and orientations chosen to create a desired image on the substrate during pattern transfer;
    calculating an effective shadow angle of the radiation on the defined features for a plurality of points on the patterning device; and
    adjusting the defined features to compensate the desired image for displacement and dimension errors based on the calculated effective shadow angles by adjusting the size and/or position of the defined features.

2. A method of generating a photolithography patterning device according to claim 1, wherein the defined features are adjusted using a thickness of an absorber layer used to define the features and/or an intensity damping of said absorber.

3. A method of generating a photolithography patterning device for transferring a pattern formed in the device onto a substrate utilizing a lithographic projection apparatus, the method comprising:
    defining features within the pattern formed in the device, wherein the features have dimensions and orientations chosen to create a desired image on the substrate during pattern transfer; and
    adjusting the defined features to compensate the desired image for displacement and dimension errors correlated to the position of the features within an exposure slit during pattern transfer by adjusting the size and/or position of the defined features.

4. A method of generating a photolithography patterning device according to claim 3, wherein the defined features are adjusted using a thickness of an absorber layer used to define the features and/or an intensity damping of said absorber.

5. A patterning device for transferring a pattern formed in the patterning device onto a substrate utilizing a lithographic projection apparatus, wherein the patterning device comprises an absorber layer having a predefined patterned structure, wherein the absorber layer is made of glass and/or glass ceramic and is positioned over a reflective surface, and wherein the patterned structure of the absorber layer is configured to create a shadow on the reflective surface when the patterning device is illuminated with radiation.

6. A patterning device according to claim 5, wherein said absorber layer is made of glass ceramic.

7. A patterning device according to claim 5, further comprising a multilayer stack, wherein the reflective surface is provided by the multilayer stack.

8. A patterning device according to claim 7, further comprising a buffer layer positioned in between the absorber layer and the multilayer stack.

* * * * *